US007956336B2

(12) United States Patent
Kaga

(10) Patent No.: US 7,956,336 B2
(45) Date of Patent: Jun. 7, 2011

(54) FOCUSED ION BEAM APPARATUS

(75) Inventor: Hiroyasu Kaga, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 246 days.

(21) Appl. No.: 12/417,308

(22) Filed: Apr. 2, 2009

(65) Prior Publication Data

US 2009/0256081 A1 Oct. 15, 2009

(30) Foreign Application Priority Data

Apr. 11, 2008 (JP) ................................. 2008-103022

(51) Int. Cl.
*H01J 37/317* (2006.01)
(52) U.S. Cl. .................................. 250/492.21; 250/309
(58) Field of Classification Search ............. 250/492.21, 250/309
See application file for complete search history.

(56) References Cited

U.S. PATENT DOCUMENTS 5,012,109 A * 4/1991 Shichi et al. ............... 250/491.1

OTHER PUBLICATIONS

Excerpt from "Electron/Ion Beam Optics," by Katsumi Ura, published by Kyoritsu Shuppan, 1994, pp. 44-45 and 72-73, with English Translation.

* cited by examiner

*Primary Examiner* — Kiet T Nguyen
(74) *Attorney, Agent, or Firm* — McDermott Will & Emery LLP

(57) ABSTRACT

An object of the present invention is to provide a focused ion beam apparatus that is capable of obtaining a much larger beam current and forming a focused ion beam with smaller aberration than a conventional focused ion beam apparatus no matter whether the level of acceleration is high or low. The focused ion beam apparatus according to the present invention includes a liquid metal ion source, an extraction electrode for extracting an ion beam from the liquid metal ion source, an acceleration (ground) electrode for accelerating an ion beam, and an electrostatic lens for converging an ion beam. When the acceleration voltage applied to the liquid metal ion source is lower than an emission threshold voltage of the liquid metal ion source, the voltage of the extraction electrode is at a lower potential than the voltage of the acceleration (ground) electrode. The polarity of a voltage applied to the electrostatic lens changes in accordance with the polarity of a voltage applied to the extraction electrode. The present invention makes it possible to exercise a deceleration mode focusing method at a high acceleration voltage from the dielectric strength voltage of an electrostatic lens and exercise an acceleration mode focusing method at a low acceleration voltage with an electrostatic lens having the same focal length as for the deceleration mode focusing method.

16 Claims, 12 Drawing Sheets

DECELERATION MODE

ACCELERATION MODE

CONFIGURATION OF ELECTROSTATIC LENS

RELATIONSHIP BETWEEN Ga INCIDENT ENERGY
AND Si DAMAGE LAYER ated ions
is passed to the constituent atoms of the sample. Consequently, the constituent atoms of the sample are flicked, swayed, and moved away from a lattice location to create a hole and release secondary electrons so that the kinetic energy turns into thermal energy. The atomic arrangement of the sample then collapses to produce a damage layer in which a regular atomic arrangement specific to the sample is broken. The size of the sample's damage layer decreases with a decrease in the irradiation energy.

FIG. 2 shows the results of a study that was conducted to determine the relationship of a Si damage layer to Ga ion irradiation energy.

FIG. 2 indicates that if a thin film having a thickness of approximately 100 nm is prepared in a situation where the ion beam irradiation energy is 30 keV, a damage layer having a thickness of 25 nm is formed on each surface of the thin film. As the damage layer is formed on both surfaces of the thin film having a thickness of 100 nm, about half its structure suffers from radiation damage and allows its atomic arrangement to collapse. Therefore, if this thin film is observed as a TEM sample, an image having a distinct atomic arrangement cannot be obtained.

To reduce the thickness of the damage layer, it is necessary to decrease the acceleration voltage of the focused ion beam apparatus. As is obvious from FIG. 2, it can be predicted that the thickness of the damage layer will be 8 nm if the irradiation energy is 5 keV, 4 nm if the irradiation energy is 2 keV, and 3 nm if the irradiation energy is 1 keV.

When, for instance, the focused ion beam apparatus is used to prepare a thin film (TEM sample) having a thickness of 100 nm with a damage layer reduced in thickness to 10% or less, it is necessary to perform an ion beam process at an irradiation energy of not higher than 2 keV. More specifically, it is necessary to produce a thin-film TEM sample at an acceleration voltage of 30 kV and perform an ion beam process on the surface of the sample at an acceleration voltage of 2 kV to remove the damage layer from the sample surface.

In recent years, it has been demanded that TEM/STEM samples be further decreased in thickness and freed of a damage layer as described above. Thus, a focused ion beam apparatus capable of operating at a wide range of acceleration voltages from high to low is needed. However, a focused ion beam apparatus capable of handling a low acceleration voltage has the following problems unlike a focused ion beam apparatus capable of handling a high acceleration voltage only:

(1) The beam current decreases in substantial proportion to the acceleration voltage $V_a$.

(2) The energy variation $\Delta E$ of ions radiated from a Ga liquid metal ion source is not smaller than 5 eV and is incomparably greater than in the case of an electron beam. Further, the amount of chromatic aberration is proportional to $\Delta E/V_a$. Therefore, beam expansion occurs at low acceleration.

(3) The chromatic aberration coefficient of an electrostatic lens is greater than that of an electromagnetic lens.

(4) The divergence point of an ion gun capable of decreasing the beam diameter at a large current is close to the ratio between extraction voltage $V_e$ and acceleration voltage $V_a$, which is $V_e/V_a=7$. Further, the emission threshold voltage $V_e$ of a liquid metal ion source is approximately 7 kV. Therefore, divergence occurs at an acceleration voltage $V_a$ of approximately 1 kV, thereby making it difficult to exercise beam control.

(5) As the irradiation energy decreases with a decrease in the acceleration voltage, the sputtering yield (the number of

FOCUSED ION BEAM APPARATUS

BACKGROUND OF THE INVENTION

1. Field of the Invention

The present invention relates to a charged particle radiation apparatus that controls the beam convergence characteristics of charged particle radiation. More specifically, the present invention relates, for instance, to a focused ion beam apparatus that is capable of producing a thin beam even when a large beam current flows at various acceleration voltages.

2. Description of the Related Art

In recent years, a technology for microfabricating a sample by irradiating it with a thin, high-energy charged particle beam, particularly, with an ion beam, has been frequently used. When a sample is to be microfabricated with an ion beam, the speed and sophisticatedness of such microfabrication increases with an increase in the current of the ion beam and with a decrease in the diameter of the ion beam. It is therefore demanded that a focused ion beam apparatus control the beam convergence characteristics of an ion beam.

In a book titled "Electron/Ion Beam Optics," which is written by Katsumi Ura and published in 1994 by Kyoritsu Shuppan, the basic configuration of a focused ion beam apparatus is described. When controlling the beam convergence characteristic of an ion beam, a focused ion beam apparatus uses an electrostatic lens, which functions in accordance with an electric field distribution, instead of an electromagnetic lens, which functions in accordance with velocity and magnetic field distribution, because ions are heavy in mass and lower in velocity than electron beams by approximately two orders of magnitude.

The electrostatic lens (objective lens) is positioned opposite a radiation sample to radiate a thin beam onto the sample. The electrostatic lens is generally composed of three electrodes. The ion beam can be reduced to a small diameter by applying a positive or negative voltage to the intermediate electrode. The electrostatic lens exhibits more significant chromatic aberration than the electromagnetic lens. Therefore, the limit imposed on ion beam diameter reduction by the electrostatic lens generally depends on the chromatic aberration of the electrostatic lens.

SUMMARY OF THE INVENTION

The inventor of the present invention has made a careful study of TEM sample preparation with a focused ion beam and obtained the following findings.

A focused ion beam apparatus can perform a sputtering process with a positional accuracy of 100 nm or higher. Therefore, it can fabricate a convex TEM sample with an observation target contained in a flake having a thickness of approximately 100 nm. However, a damage layer is formed on the surface of the sample when it is irradiated with an ion beam.

More specifically, the irradiation energy of the focused ion beam apparatus relative to the sample is determined by multiplying the acceleration voltage by the electrical charge carried by charged particles (beam). In the case of univalent charged particles, the acceleration voltage and irradiation energy are equivalent. When the focused ion beam apparatus uses a Ga liquid metal ion source, Ga ions are univalent ions; therefore, the irradiation energy is determined by the acceleration voltage and equivalent to the kinetic energy relative to the sample as far as the sample is at a ground potential.

Ions radiated onto the sample collide with constituent atoms of the sample repeatedly and stop. During such a colatoms sputtered per incident ion) decreases. When the sputtering phenomenon is diminished, the fabrication speed decreases.

More specifically, a low-acceleration ion beam apparatus cannot obtain a sharp image because it cannot reduce the beam diameter. Further, a decrease in the beam current and a decrease in the sputtering yield synergistically reduce the fabrication speed of the focused ion beam apparatus. Therefore, a low-acceleration beam turns out to be a small-current (weak) beam. In a low-acceleration ion beam apparatus, it is difficult to obtain a beam that can process a specific spot.

An object of the present invention is to obtain a much larger beam current than a conventional focused ion beam apparatus over a wide acceleration range from high to low (even when the energy level of charged particle radiation changes, for instance, from a high energy level of 30 keV to a low energy level of approximately 0.5 keV, namely, the energy level of charged particle radiation changes by approximately two orders of magnitude), and form a focused ion beam with limited aberration.

The present invention relates to a focused ion beam apparatus that includes a liquid metal ion source, an extraction electrode for extracting an ion beam from the liquid metal ion source, an acceleration electrode for accelerating an ion beam, and an electrostatic lens for converging an ion beam. When the acceleration voltage applied to the liquid metal ion source is lower than an emission threshold voltage of the liquid metal ion source, the voltage of the extraction electrode is at a lower potential than that of the acceleration electrode. The polarity of a voltage applied to the electrostatic lens changes in accordance with that of a voltage applied to the extraction electrode.

The present invention makes it possible to exercise a deceleration mode focusing method at a high acceleration voltage from the dielectric strength voltage of an electrostatic lens and exercise an acceleration mode focusing method at a low acceleration voltage with an electrostatic lens having the same focal length as for the deceleration mode focusing method. As the present invention can reduce the chromatic aberration and decrease the beam diameter even at low acceleration, it is possible to obtain a sharp image over a wide acceleration range from high to low. Further, as the chromatic aberration can be reduced even at low acceleration, the apparatus according to the present invention causes a relatively small decrease in the current density and in the fabrication speed as compared to a conventional apparatus even when a large beam current is used.

BRIEF DESCRIPTION OF THE DRAWINGS

Other objects and advantages of the invention will become apparent from the following description of embodiments with reference to the accompanying drawings in which.

DETAILED DESCRIPTION OF THE PREFERRED EMBODIMENTS

Figure 1B:
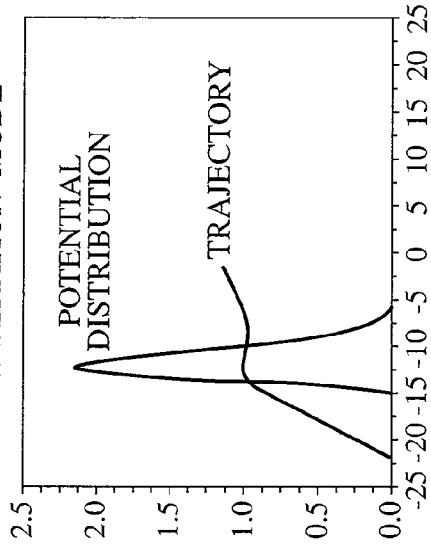
FIGS. 1A, 1B, and 1C illustrate the configuration of an electrostatic lens, a deceleration mode, or an acceleration mode.
Figure 1C:
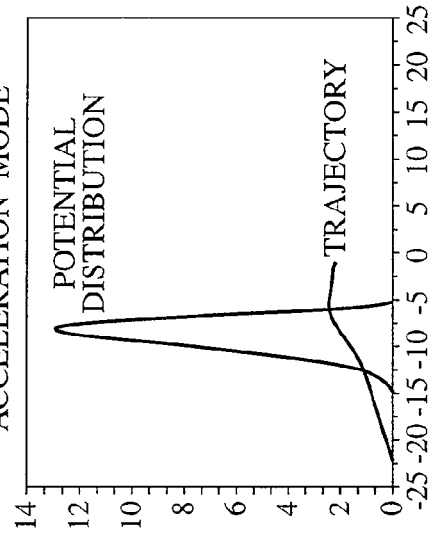
Figure 1A:
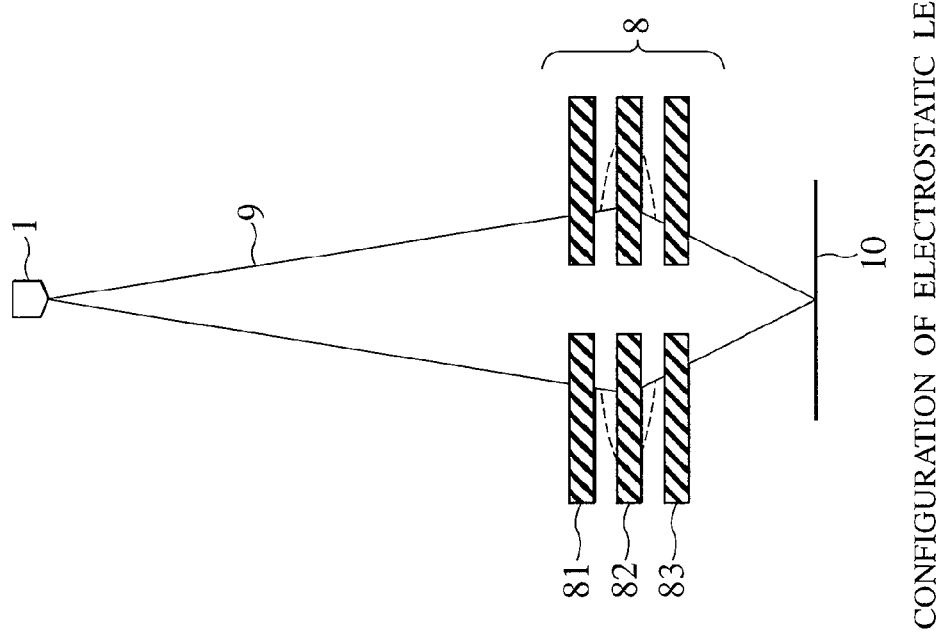

In a focused ion beam apparatus, an electrostatic lens whose inlet and outlet are at the same potential is used to converge an ion beam. FIG. 1A is a schematic diagram illustrating the structure of an electrostatic lens that is used to converge a positively charged ion beam. The electrostatic lens 8 includes three electrodes: an inlet electrode 81, an outlet electrode 83, and an intermediate electrode 82 which is positioned between the inlet electrode 81 and the outlet electrode 83. The inlet electrode 81 and the outlet electrode 83 are maintained at the same potential as that of an ion beam irradiation sample (target) 10.

The electrostatic lens 8 is characterized in that it is capable of focusing an ion beam 9 no matter whether the potential of the intermediate electrode 82 is higher or lower than that of the inlet electrode 81 and outlet electrode 83.

A focusing method of producing a focused ion beam from a positively charged ion beam 9 by applying a positive voltage to the intermediate electrode 82 of the electrostatic lens 8 is called a deceleration mode focusing method (FIG. 1B) because the ion beam 9 is decelerated before its incidence on the electrostatic lens 8 and focused in the electrostatic lens 8. On the other hand, a method of applying a negative voltage to achieve focusing is called an acceleration mode focusing method (FIG. 1C) because the ion beam 9 is accelerated before its incidence on the electrostatic lens 8 and focused in the electrostatic lens 8.

To reduce the ion beam diameter, it is prerequisite that a lens with small aberration be used at a short focal length. The deceleration mode focusing method achieves focusing at a much lower voltage than the acceleration mode focusing method. On the other hand, the acceleration mode focusing method achieves focusing with much smaller lens aberration than the deceleration mode focusing method.

The acceleration mode focusing method is disadvantageous in that an extremely high voltage is required when the diameter of a high-energy ion beam is to be reduced at a short focal length. When, for instance, a beam having a beam current of several tens of nanoamperes is to be focused onto a sample with an electrostatic lens having a focal length of 14 mm at an acceleration voltage of 30 kV, which voltage is usually used for microfabrication, it is necessary to apply a voltage as high as −80 kV to the intermediate electrode of the electrostatic lens. In this instance, the chromatic aberration coefficient $C_c$ is approximately 40 mm. However, the inlet electrode 81, intermediate electrode 82, and outlet electrode 83, which constitute the electrostatic lens, are spaced at intervals of approximately 3 mm. Therefore, when such a high voltage is applied to the intermediate electrode 82, an electrical discharge occurs because an electric field having a strength as great as 27 kV/mm is applied between the inlet electrode 81 and intermediate electrode 82 and between the intermediate electrode 82 and outlet electrode 83. The permissible electric field strength for avoiding an electrical discharge in a vacuum is approximately 10 kV/mm in a vacuum.

On the other hand, when the deceleration mode focusing method is used to reduce the diameter of an ion beam under the same conditions as for the above-described acceleration mode focusing method, that is, when the deceleration mode focusing method is used to focus a beam having a beam current of several tens of nanoamperes onto a sample with an electrostatic lens having a focal length of 14 mm at an acceleration voltage of 30 kV, it is necessary to apply a voltage as high as 21 kV to the intermediate electrode of the electrostatic lens. In this instance, the chromatic aberration coefficient $C_c$ is approximately 74 mm. The electric field between the electrodes of the electrostatic lens has a strength of 7 kV/mm. Consequently, it can be expected that a stable operation will be performed without exceeding the permissible electric field strength for avoiding an electrical discharge in a vacuum (approximately 10 kV/mm).

Figure 3:
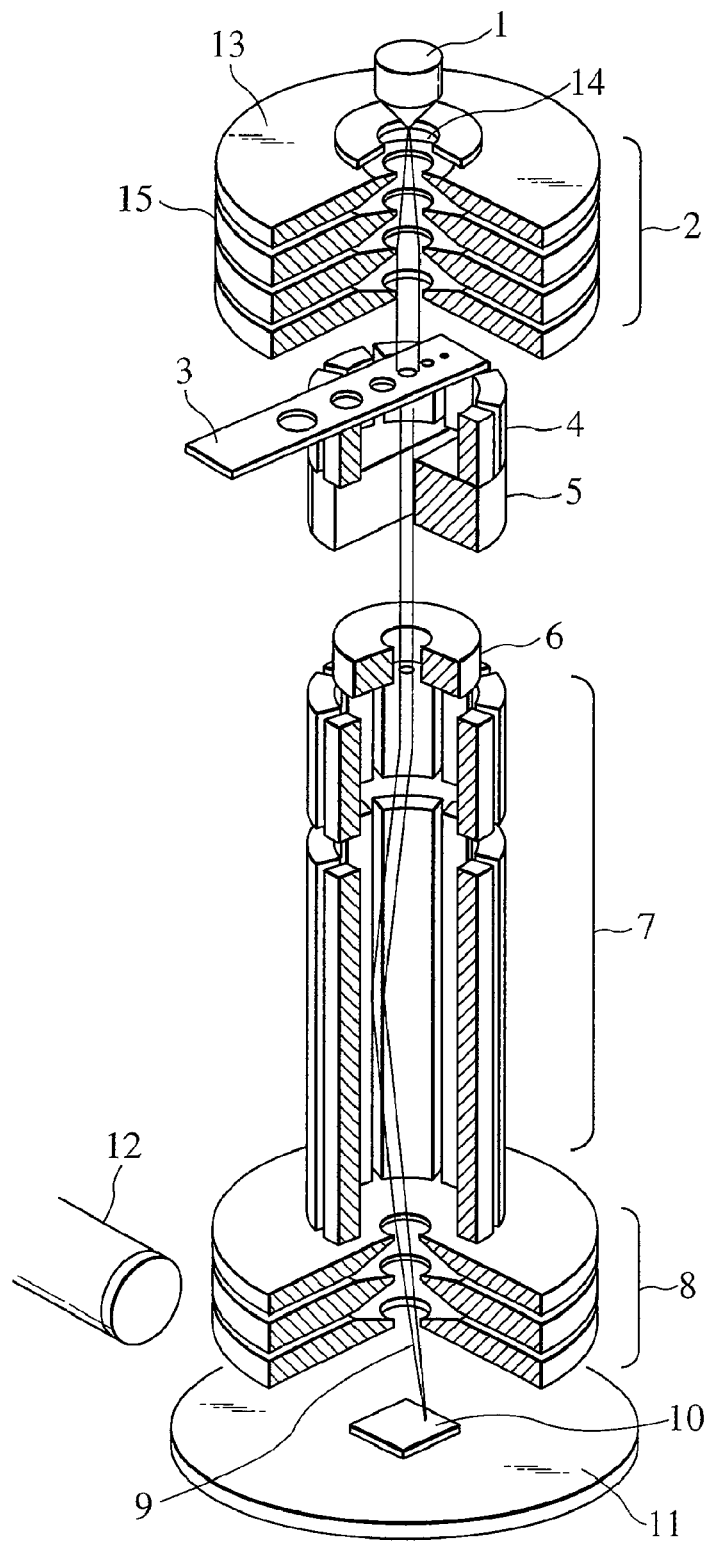
FIG. 3 shows a focused ion beam apparatus.

FIG. 3 is a partial cross-sectional perspective view illustrating the basic configuration of the focused ion beam apparatus according to the present embodiment.

The ion beam 9 released from a liquid metal ion source 1 is limited by a beam-limiting (GUN) aperture 14 of an extraction electrode 13 and accelerated to a desired energy by a ground (acceleration) electrode 15. The ion beam 9 focused by a condenser lens 2 is radiated onto a diaphragm device 3. The diaphragm device 3 includes, for instance, four apertures, which are 5 μm, 40 μm, 200 μm, and 500 μm in diameter and function as a variable aperture that is moved rightward and leftward by an aperture movement device. More specifically, the diaphragm device 3 can place a desired aperture on the central axis of the apparatus. After passing through the aperture of the diaphragm 3, the beam enters the electrostatic lens 8 through an aligner/stigma 4, a blanker 5, a blanking plate 6, and a beam scanner 7. The diameter of the ion beam 9 is reduced by the electrostatic lens 8, which serves as an objective lens, and radiated onto the sample 10 (ground potential) mounted on a sample stage 11. An ion beam irradiation position on the sample 10 is controlled by the beam scanner 7. A signal generated by radiating the ion beam 9 on the sample 10 is detected by a detector 12 and synchronized with an operation signal of the beam scanner 7 to display an image on a screen.

The fundamental characteristics of an ion optical system of the focused ion beam apparatus shown in FIG. 3 will now be briefly described.

The ion source 1 has a potential energy equivalent to the value $q \times V_a$, which is obtained by multiplying the acceleration voltage $V_a$ by the amount of ion charge q, in relation to the grounded sample. In this instance, the potential energy of the ion source 1 is entirely converted to kinetic energy on the sample 10.

The kinetic energy of ions radiated from the ion source 1 (object point) that prevails until they are radiated onto the sample 10 (image point) is accelerated to $q \times (V_a - V_a)$ when they pass through the extraction electrode 13 and to $q \times V_a$ when they pass through the ground (acceleration) electrode 15. As the ion beam 9 is refracted in accordance with a velocity change, it experiences a lens effect when acceleration is provided by a rotationally symmetrical electric field. It should be noted, however, that the value $V_e$ denotes an emission threshold voltage.

When the image magnification of the ion optical system is M, the angular magnification is $m_\alpha$, the extraction voltage (object point voltage) is $V_e$ (the emission threshold voltage, that is, the voltage required for radiating ions from the ion source), and the acceleration voltage is $V_a$ (the potential of the ion source relative to the ground potential), the relationship between M and $m_\alpha$ is as follows:

$$M \cdot m_\alpha = (V_e/V_a)^{0.5} \qquad \text{[Formula 1]}$$

$$m_\alpha = \beta/\alpha_g$$

where the aperture angle of the object point is $\alpha_g$ and the aperture angle of the image point is $\beta$ $$\therefore \alpha_g = M \cdot \beta \cdot (V_a/V_e)^{0.5}$$

The radiation angle current density Jω of the ion source is substantially constant. The beam current Ib is limited by the downstream aperture of the ion source. The relationship between the radiation angle current density Jω and the beam current Ib is as follows:

$$Ib = J\omega \cdot \pi \cdot \alpha_g^2 \qquad \text{[Formula 2]}$$
$$= J\omega \cdot \pi \cdot (M \cdot \beta)^2 \cdot (V_a/V_e)$$

$\beta = Dap/2/L$ (The lens effect produced downstream of the aperture is assumed to be constant (L=constant))

where Dap is the diameter of the aperture and L is the distance between the aperture and the image plane.

Therefore, when $V_e$ is constant, $M \approx 1$. When $\beta$ is assumed to be constant, Formula 2 indicates that Ib is proportional to the acceleration voltage $V_a$.

When the light source size of the ion source is $d_0$, the energy spread of the ion source is $\Delta E$, the magnification of the ion optical system is M, the chromatic aberration coefficient is $C_c$, the spherical aberration coefficient $C_s$, the convergent angle of the objective lens image plane is $\alpha$, and the diffraction aberration is ineffective due to the heavy mass of ions, the beam diameter d of the ion optical system is obtained from the following relational expression:

$$d^2 = \left[C_c \frac{\Delta E}{V_a} \alpha\right]^2 + (M \cdot d_0)^2 + \left[\frac{1}{2} C_s \alpha^3\right]^2 \qquad \text{[Formula 3]}$$

In the focused ion beam apparatus for a Ga liquid metal ion source, the energy spread $\Delta E$ of the ion source is approximately 7 eV when the emission current Ie is 3.2 μA and approximately 5 eV when the emission current Ie is 1.5 μA. In general, it is not smaller than 5 eV. The size of a virtual light source is approximately 50 nm. The radiation angle current density Jω of the Ga liquid metal ion source alone is approximately 20 μA/sr. However, the practical value is approximately 17 μA/sr because the beam current passing through an aperture during beam axis adjustment decreases due to the influence of the diameter and thickness of a beam-limiting aperture or variable aperture.

When the level of energy is high (when, for instance, the acceleration voltage is within the range from 10 kV to 30 kV and higher than the emission threshold voltage of the ion source (extraction voltage for ion emission)), not only the first term of Formula 3 but also its second and third terms affect the beam diameter depending on the beam current. Therefore, the magnification of the ion optical system can be controlled so as to obtain the maximum current density in accordance with the beam current. This makes it possible to obtain an appropriate beam current while suppressing the increase in the beam diameter.

To obtain the maximum current density, the first and second terms of Formula 3 are made substantially equal. To obtain high resolution, the focal length is reduced because it is necessary to decrease the second term. Meanwhile, when the focal length is long, the column increases in order to obtain an appropriate optical system magnification. However, the length of the column and the focal length are reduced because the influence of space-charge effect and vibration such as floor vibration and sound-induced vibration cannot easily be avoided.

The electrostatic lens (objective lens) operates with the value WD (distance between objective lens lower surface and sample) set to approximately 5 mm because it is necessary, for instance, to avoid interference with structures around the objective lens and obtain adequate efficiency of secondary electron signal detection. When, for instance, the vacuum dielectric strength voltage is assumed to be 10 kV/mm, a maximum of 30 kV (three times the vacuum dielectric strength voltage) is applied to the electrodes with the interelectrode distance set to 3 mm.

If the electrostatic lens operates in an acceleration mode in which the acceleration voltage is 30 kV with the value WD set to 5 mm, the voltage applied to the intermediate electrode of the electrostatic lens is as high as −100 kV so that the electric field between the electrodes is −33 kV/mm. Therefore, the electrostatic lens is operated in a deceleration mode because the objective lens having a WD of 5 mm cannot be operated in the acceleration mode in relation to a high-energy beam.

The convergent angle α of the objective lens of the focused ion beam apparatus is not greater than several milliradians and the total magnification M of the optical system is nearly equal to 1. When the acceleration voltage $V_a$ is 1 kV, its ratio to an acceleration voltage of 30 kV is 30 so that the first term of Formula 3 is multiplied by approximately 30. Therefore, the lowest-energy beam diameter is approximately 30 times greater than at an acceleration voltage of 30 kV.

Further, as is obvious from Formula 2, the beam current is such that the value β varies because the value M slightly varies with the acceleration voltage. However, the beam current Ib decreases in substantial proportion to a decrease in the acceleration voltage $V_a$.

Furthermore, when the beam energy decreases, the sputtering yield (the number of atoms sputtered per incident ion) decreases to reduce the fabrication speed. Therefore, the value β, that is, the aperture diameter Dap, is increased to increase the beam current. However, when the aperture diameter Dap increases, the value α in Formula 3 increases to increase the beam diameter d.

It is demanded that even a focused ion beam apparatus capable of reducing the beam diameter at a low acceleration voltage to obtain an appropriate beam current properly handle a large current and high current density in a high acceleration voltage region and reduce the beam diameter in a low acceleration voltage region.

To obtain a thin ion beam, it is prerequisite that a lens with small aberration be used at a short focal length, as described earlier.

To reduce the diameter of a low-energy beam, it is necessary to minimize the first term of Formula 3. In addition, it is important that the chromatic aberration coefficient $C_c$ of the electrostatic lens be decreased. The chromatic aberration coefficient $C_c$ of the electrostatic lens can be decreased in two different ways as the relationship between $C_c$ and f is as indicated below:

$$\frac{C_c}{f} = 2 \cdot (\phi_0 \cdot \phi_1)^{\frac{1}{4}} / \sqrt{\phi_m} \quad \text{[Formula 4]}$$

where $\phi_m$ is the potential at the maximum lens effect position
(1) Producing a Lens Effect at a High Energy Level
=Acceleration Mode Focusing Effect As the lens effect is produced at a negative voltage, the movement velocity prevailing during lens electrode passage is high. Therefore, the chromatic aberration can be reduced.
(2) Minimizing the Focal Length
=Acceleration Voltage Reduction (Inapplicable to an Electromagnetic Lens; Peculiar to an Electrostatic Lens)

As the focal length is decreased, high acceleration and strong magnetic field are required for the use of an electromagnetic lens. However, when an electrostatic lens is used, the acceleration voltage is not a governing factor because refraction occurs in accordance with the square roots of voltages developed before and after an electrode. Therefore, when a low-energy beam is used, the acceleration mode can be executed at a short focal length with a practical voltage applied.

Figure 2:
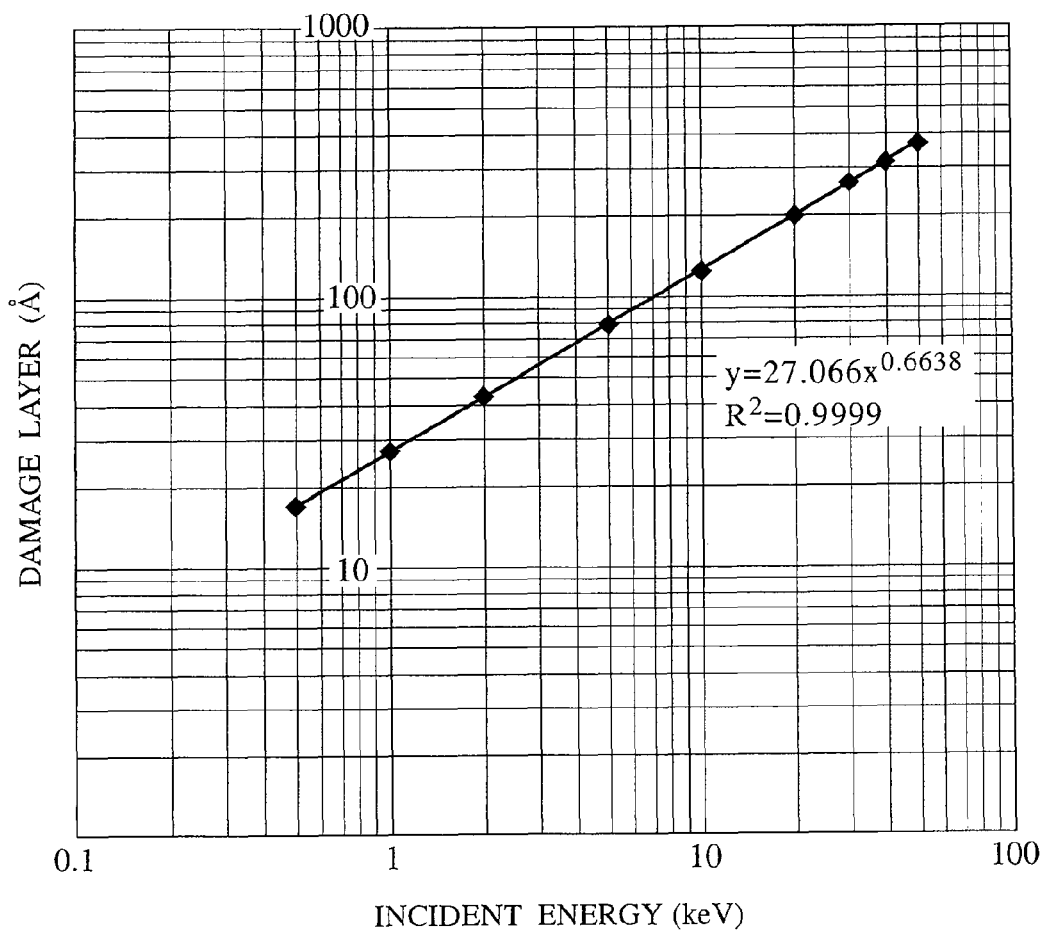
FIG. 2 illustrates the relationship between a Si damage layer to Ga ion irradiation energy.

FIG. 2 shows the relationship of a Ga acceleration voltage (incident ion energy) and a Si damage layer.

The thickness of a damage layer decreases with a decrease in the acceleration voltage. When a 100 nm thick TEM sample (thin film) is prepared in such a manner that the damage layer thickness is 10% of the film thickness, the thickness of a single damage layer needs to be not greater than 5 nm (=10 nm/2). In such an instance, FIG. 2 indicates that the required acceleration voltage is not higher than 2 kV.

Similarly, when the film thickness is 200 nm, the thickness of a single damage layer can be 10 nm. FIG. 2 indicates that the acceleration voltage required for a focused ion beam is not higher than 7 kV. However, an ultrahigh-voltage transmission electron microscope is needed because the number of transmitted electrons decreases. Observations cannot readily be conducted with a 200 kV transmission electron microscope.

Further, when the thickness of a 50 nm thick damage layer is to be 10% of the film thickness, the thickness of a single damage layer needs to be not greater than 2.5 nm (=5 nm/2). In this instance, however, it is necessary to perform fabrication at an acceleration voltage of 500 V.

Consequently, the required thickness of the TEM sample is approximately 100 nm or less. The TEM sample is obtained by processing a thin film having a thickness of approximately 100 nm with high positional accuracy at a high acceleration voltage and removing the resulting damage layers with a beam having an acceleration voltage of not higher than 2 kV. Damage layer removal is often accomplished with an Ar-ion-based milling apparatus. As the radiation beam diameter cannot be decreased, a portion other than the damage layers may also be milled together for contamination. Thus, a dedicated milling apparatus is required to achieve damage removal.

A focused ion beam apparatus capable of handling a low acceleration voltage can use a focused ion beam having a low acceleration voltage to remove a damage layer at a specific spot, which was produced when fabrication was performed with a focused ion beam having a high acceleration voltage.

A method of radiating an ion beam from a liquid metal ion source at a low acceleration voltage will now be described. When the electric field strength is approximately $10^8$ V/cm, the liquid metal ion source begins to emit ions. The electric field length depends on the curvature radius of the leading end of the liquid metal ion source (LMIS), the distance between the LMIS leading end and extraction electrode, and the shape of the electrode. When the employed liquid metal ion source is a commonly-used, needle type Ga liquid metal ion source (hereinafter referred to as the LMIS) that is shaped like a circular cone having a vertex angle of 70° and a curvature radius of approximately 3 μm at its leaning end, the voltage required for ion emission (emission threshold voltage) ranges from +6 kV to 10 kV depending on the surface roughness of the circular cone (depending on whether Ga is properly supplied).

The required electric field strength can be obtained as far as there is a potential difference. To provide an acceleration voltage that is not higher than the emission threshold voltage of the LMIS, therefore, it is necessary to apply an acceleration voltage to the LMIS and apply a voltage to the extraction electrode so that the resulting LMIS potential is equal to or lower than the emission threshold voltage at all times.

The extraction voltage output Vext is such that $V_a<V_e$ when the acceleration voltage $V_a$ decreases to increase the threshold voltage $V_e$ for ion emission. Therefore, the voltage $V_{ext}(=V_a-V_e)$ to be applied to the extraction voltage is high and negative. Further, when Ga oxidation and Ga recession from LMIS leading end during an emission interruption are taken into account, a negative power supply having a maximum voltage of approximately 12 kV in consideration of the likelihood of an emission threshold voltage shift needs to be used as an extraction power supply Vext. To obtain a beam having an acceleration voltage between 30 kV and 0.5 kV, for example, the voltage output Vext of the extraction power supply should be approximately between 25 kV and −12 kV.

When a focused ion beam apparatus capable of handling a low acceleration voltage is to be used to control the beam current and beam diameter, the ion gun produces a strong lens effect particularly at low acceleration. It is therefore important that the ion gun be optimized.

Figure 5:
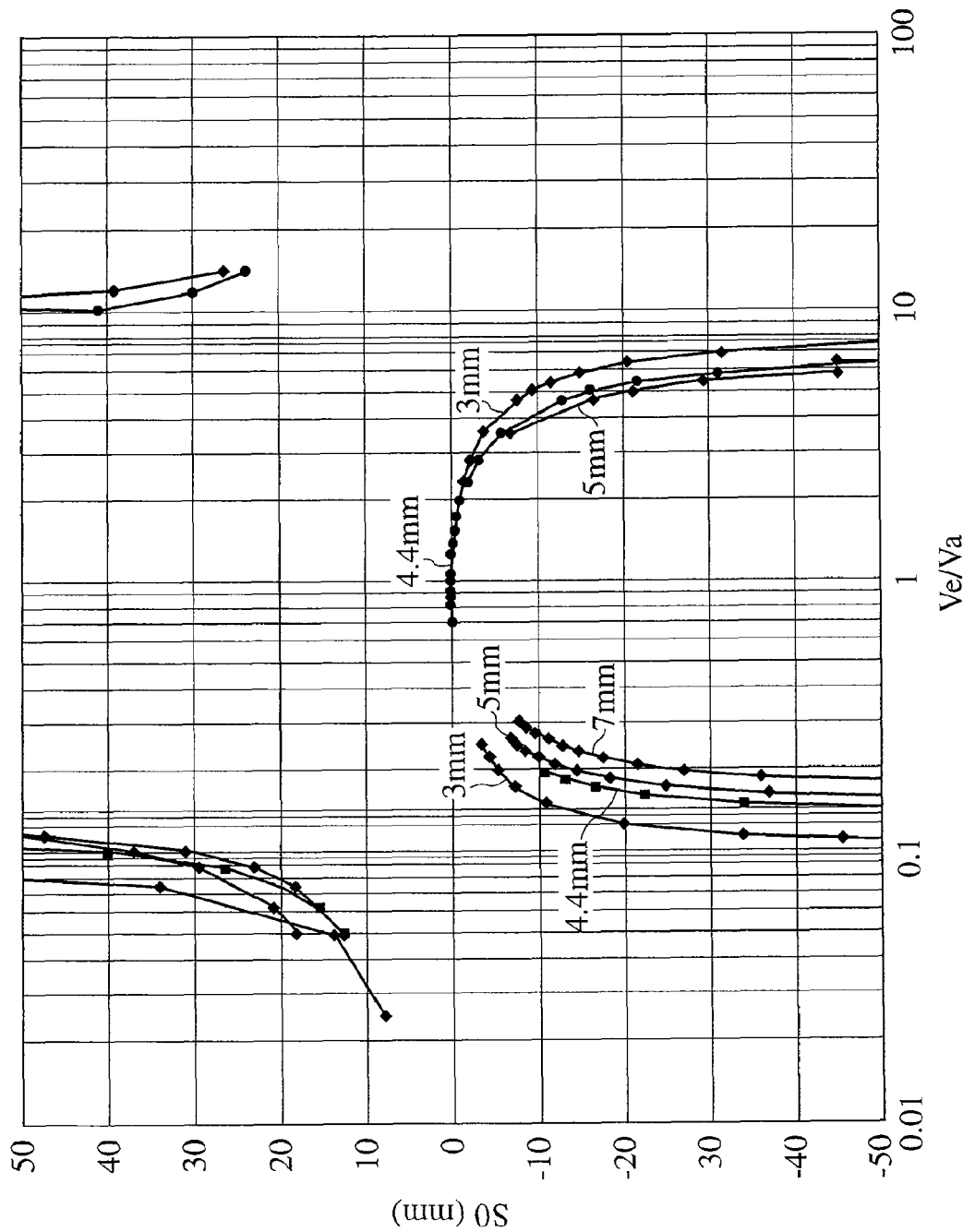
FIG. 5 shows model calculation results to illustrate the $V_e/V_a$ characteristic of an ion gun.

FIG. 5 shows the results that were obtained when the lens effect of an ion gun was calculated.

Figure 4A:
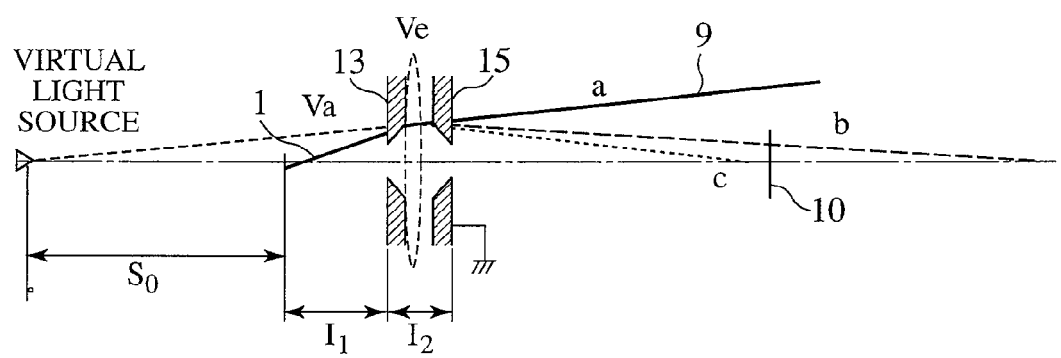
FIGS. 4A and 4B are schematic diagrams illustrating the $V_e/V_a$ characteristic of an ion gun.

As shown in FIG. 4A, the ion gun as configured according to the calculation includes an ion source 1, an extraction electrode 13, and a ground electrode 15, and is capable of handling a maximum acceleration voltage of 30 kV. When the vacuum dielectric strength voltage is assumed to be 10 kV/mm, the inter-electrode distance S for providing a dielectric strength voltage of 30 kV between the extraction electrode and ground electrode is not shorter than 3 mm. Therefore, an electrode thickness of 3 mm was employed with the inter-electrode distance set to 10 mm (with the spacing interval set to 4 mm). The lens effect of the ion gun is determined by the ratio between the acceleration voltage $V_a$ and extraction voltage $V_e$ ($V_e/V_a$). FIGS. 4A and 5 show the results that were obtained when the position S0 of a virtual ion source (the apparent position of an ion emission point as viewed from a sample, that is, the image point) relative to $V_e/V_a$ (lens effect) was determined.

Figure 4B:
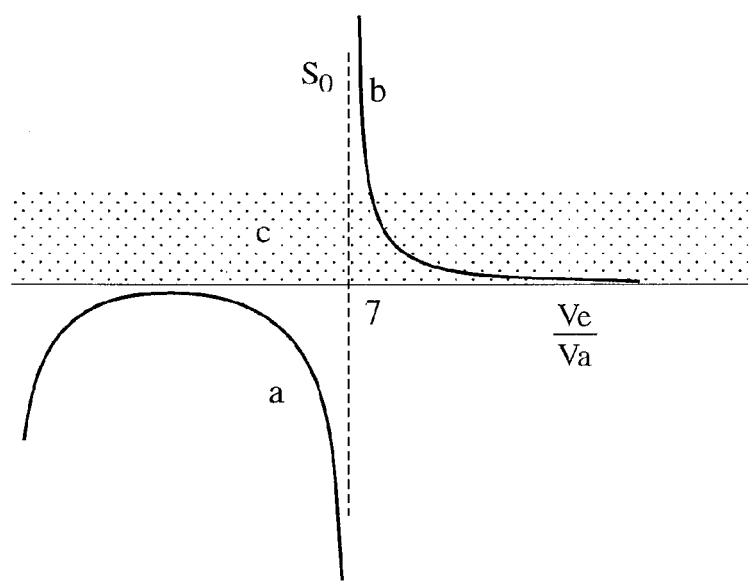

At a high acceleration voltage, the position S0 of the virtual light source is as indicated by "a" in FIG. 4B. At a low acceleration voltage, the position S0 changes from "a" to "b" in FIG. 4B as the lens effect of the ion gun increases with an increase in $V_e/V_a$, and when $V_e/V_a$ is further increased, the position S0 is as indicated by "c" in FIG. 4B so that a beam is focused between the ion source and the sample. At a position close to "c" in FIG. 4A at which the beam is focused between the ion source and the sample, $V_e/V_a$ greatly changes even when the setting of $V_a$ slightly changes. This causes the convergence point to change, thereby making it difficult to control the beam current. The resulting state corresponds to region S0 in the shaded area of FIG. 4B that is positioned beyond a divergence point (S0±∞) of 7 in FIG. 4B. Therefore, the use of an area close to such a region should be avoided.

The divergence point varies with the distance between the leading end of the ion source (LMIS) shown in FIG. 5 and the extraction electrode. However, the divergence point is at a location indicated by $V_e/V_a\approx7$ when the distance is 5 mm.

When the emission threshold voltage $V_e$ of the LMIS is 7.3 kV as indicated in FIG. 5 and the acceleration voltage $V_a$ of the employed ion beam apparatus varies from 30 kV to 1 kV, $V_e/V_a$ changes from approximately 0.24 to 7.3. Therefore, a divergence point of $V_e/V_a=7$ is exceeded when the acceleration voltage $V_a$ is approximately 1 kV. Beam convergence then occurs between the ion source and the sample. This situation can be avoided, for instance, by using an ion source having an extraction voltage $V_a$. This ensures that $V_e/V_a$ is 6 when the acceleration voltage $V_a$ is 1 kV. Thus, an acceleration voltage between 30 kV and 1 kV can be used without exceeding a divergence point of 7. Further, when the distance between the ion source and the extraction electrode is approximately 3 mm, the divergence point can be raised to $V_e/V_a=8.4$ as indicated by the results shown in FIG. 5.

However, decreasing the extraction voltage $V_e$ lowers the image resolution at an acceleration voltage of 30 kV.

The image resolution at an acceleration voltage of 30 kV is important because it corresponds to the maximum resolution of the apparatus. As the size of the ion source is approximately 50 nm, the apparatus is optimized to obtain a beam diameter of approximately 5 nm by decreasing the values α and M of Formula 3 (M≈0.07 when WD≈5 mm) to make the first and second terms substantially equal. However, when the extraction voltage $V_e$ is not higher than approximately 6 kV, the magnification of the ion gun works so as to increase the value α. The second term of Formula 3 then becomes greater than the first term. Therefore, even when the value α is decreased to reduce the beam current to a limit at which an image can be displayed, the beam diameter cannot be reduced to a desired image resolution.

Figure 6:
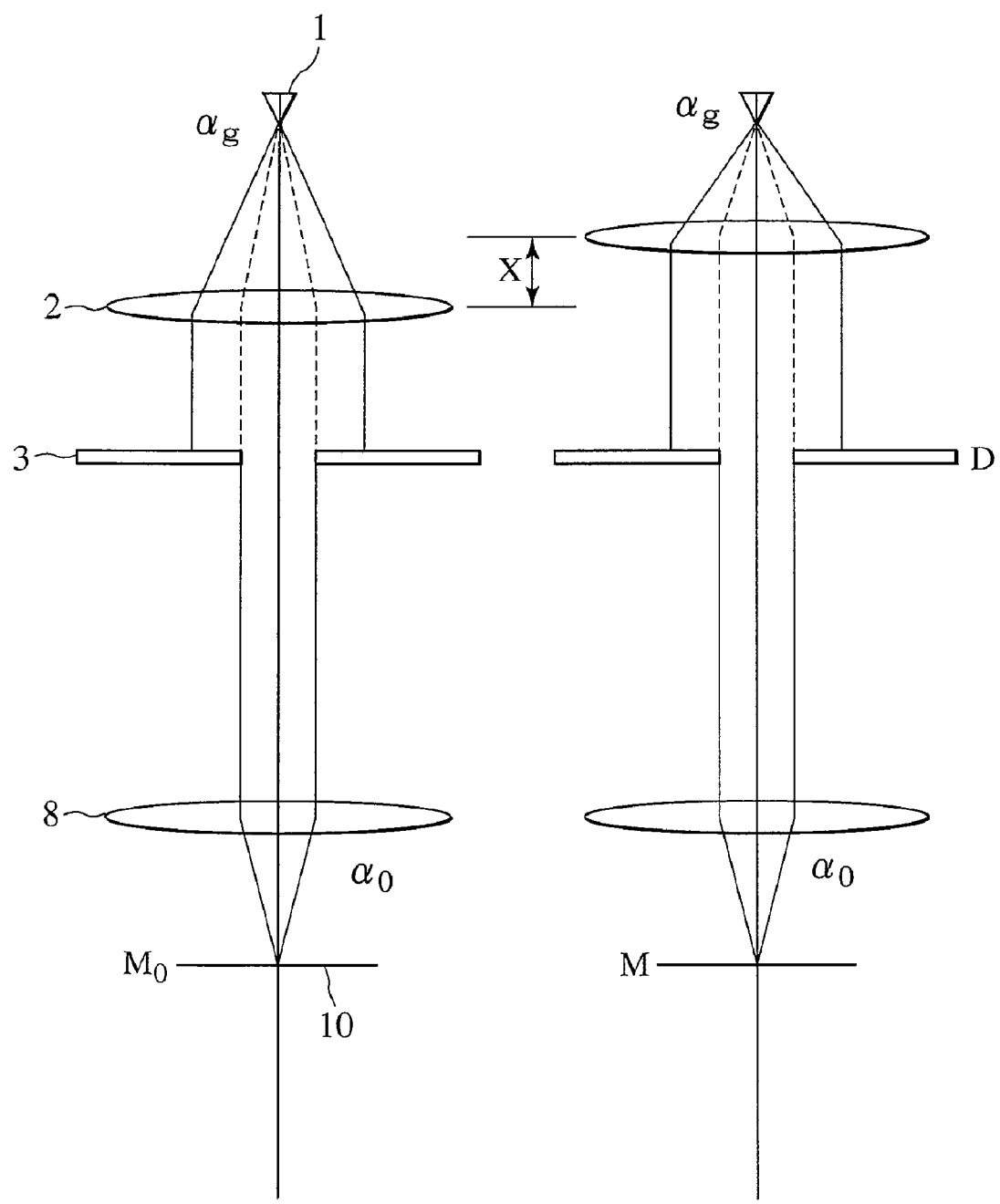
FIG. 6 shows the distance between an LMIS and a condenser lens.

When the diameter of a large-current ion beam 9 is to be reduced at an acceleration voltage of 30 kV, the distance between the LMIS and the condenser lens 2 is important. Even when the image plane divergence angle αo of the objective lens is constant as shown in FIG. 6, moving the condenser lens 2 toward the LMIS increases the object point divergence angle $α_g$ of the ion gun, thereby increasing the beam current. Meanwhile, the beam diameter remains substantially unchanged because the image plane divergence angle αo of the objective lens is constant.

When the LMIS 1 is positioned close to the condenser lens 2, it is possible to configure a high-speed fabrication focused ion beam apparatus that obtains a large-current beam having a high current density.

To position the condenser lens 2 near the LMIS, however, it is necessary to shorten the distance between the ion gun extraction electrode 13 and ground electrode 15. Shortening the distance increases the lens effect of the ion gun. If the degree of acceleration is lowered when the lens effect is increased, a divergence point arises within an acceleration voltage range of 2 kV to 1 kV. To avoid divergence at a low acceleration voltage as described with reference to FIG. 4, it is necessary to decrease the extraction voltage $V_e$ because divergence is a parameter for ($V_e/V_a$) or position the ion source (LMIS) 1 close to the extraction electrode 13 in consideration of ion gun characteristics shown in FIG. 5.

However, the image resolution deteriorates when the extraction voltage $V_e$ decreases. Therefore, the ion source (LMIS) 1 should be positioned close to the extraction electrode 13 to avoid divergence.

At a low acceleration voltage, operations take place near the divergence point of the ion gun. However, the effect of shifting the divergence point toward a low acceleration voltage region and the effect of reducing the diameter of a large-current beam are both produced by shortening the distance between the ion source and extraction electrode.

It is necessary to adjust the divergence point of the ion gun so as to handle a desired acceleration voltage.

Figure 8:
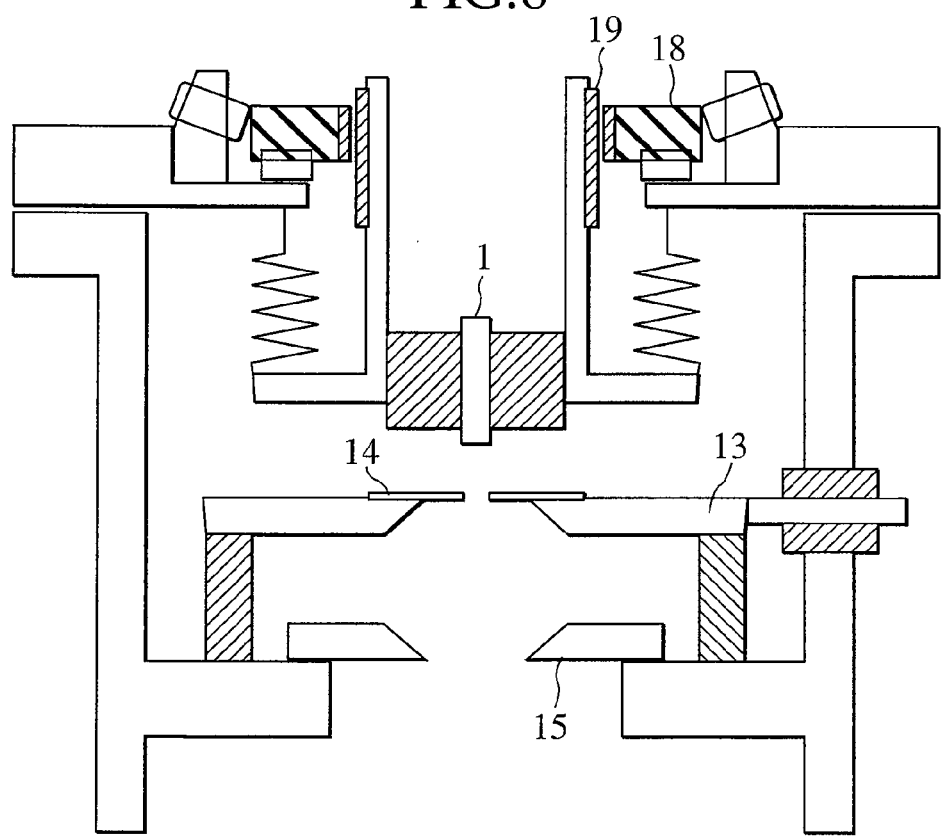
FIG. 8 shows an example of an ion gun that permits the height adjustment of an ion source.

The above adjustment can be made by changing the distance between the ion source and extraction electrode. It is preferred that an ion gun shown, for instance, in FIG. 8 or other ion gun capable of adjusting the distance between the ion source and extraction electrode in accordance with a desired minimum acceleration voltage be used as an ion gun capable of handling a low acceleration voltage. The ion gun shown in FIG. 8 is structured so that an ion source 1 is attached to the end of an internally threaded, ring-shaped disc 18 and a threaded cylinder 19 with the cylinder connected to a flange with a bellows and enclosed in a vacuum. When the ion gun shown in FIG. 8 is used, the distance between the ion source and extraction electrode can be changed by rotating the threaded ring-shaped disc 18.

Figure 7:
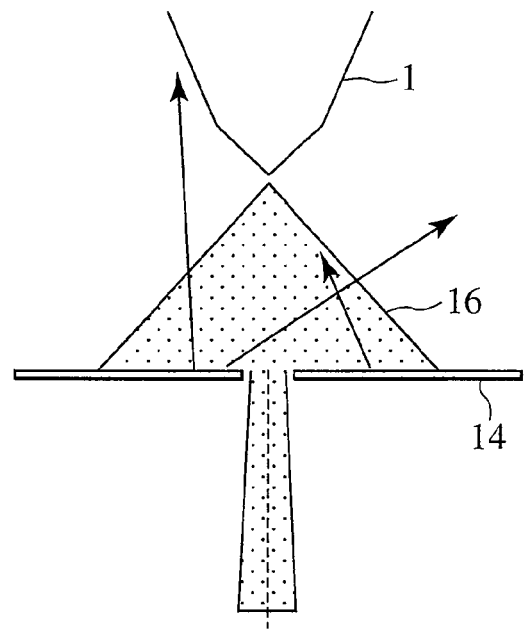
FIG. 7 illustrates the influence of an ion gun's beam-limiting aperture.

However, shortening the distance between the liquid metal ion source (LMIS) 1 and the extraction electrode 13 also shortens the distance between the LMIS and the beam limiting aperture 14, which is provided in the extraction electrode 13. In that case, the LMIS 1 may be contaminated by sputtered particles 16 from the beam-limiting aperture 14 adhering to the LMIS 1, as shown in FIG. 7, thereby making it difficult to obtain stable emission.

Figure 9:
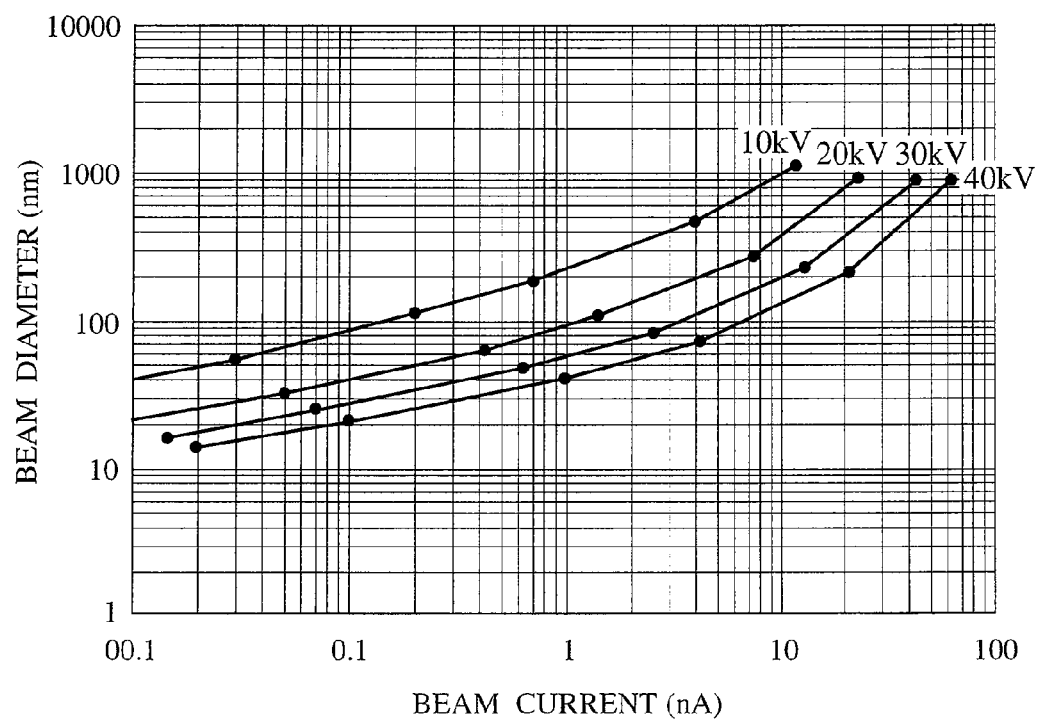
FIG. 9 shows the relationship between the beam current and beam diameter of a column shown in Table 1.

The focused ion beam apparatus shown in FIG. 3 used a Ga LMIS as the ion source 1. This apparatus obtained a beam having a diameter of approximately 1 μm and a beam current of approximately 40 nA by using an electrostatic lens (objective lens) 8 having a maximum acceleration voltage of 30 kV and a WD of approximately 6 mm. To obtain such a beam, the distance between the LMIS 1 and extraction electrode 13 was set to 5 mm with the distance between the LMIS and the principal surface of the condenser lens 2 set to 23 mm. FIG. 9 shows the results of a study that was conducted to determine the relationship of the beam current and beam diameter to the acceleration voltage of the apparatus.

Table 1 shows the results of a study that was conducted to determine the maximum beam current prevailing when a beam diameter of approximately 1 μm was obtained upon a change in the acceleration voltage, the prevailing chromatic aberration coefficient, and the objective lens application voltage. FIG. 9 indicates that the beam current is 20 nA when the acceleration voltage is 30 kV and the beam diameter is μm. As the maximum beam current of the apparatus varies with the beam diameter, the beam current prevailing when the beam diameter is between 1 μm and 0.5 μm is regarded as the maximum beam current. The description of the present embodiment relates to a focused ion beam apparatus that is capable of obtaining a maximum beam current of not smaller than 20 nA at an acceleration voltage of 30 kV.

TABLE 1

Dependence of column characteristics on acceleration voltage

|  | High acceleration | | | Low acceleration | | |
| --- | --- | --- | --- | --- | --- | --- |
| Acceleration voltage (kV) | 30 | 10 | 5 | 2 | 1 | 0.5 |
| Vext (Ve) (kV)* | 23 (7) | 3 (7) | −2 (7) | −5 (7) | −6 (7) | −6.5 (7) |
| Necessity of condenser | must | must | necessary | necessary | not necessary | not necessary |
| Objective lens operation mode (kV) | Dec/Acc 21/−80 | Dec/Acc 7/−26 | Dec/Acc 3.5/−13 | Dec/Acc 1.4/−5.5 | Acc −2.4 | Acc −1.2 |
| WD (f) (mm) | 6 (14) | 6 (14) | 6 (14) | 6 (14) | 6 (14) | 6 (14) |
| Cc (mm) | 75/40 | 76/42 | 68/33 | 67/32 | 73/39 | |
| Maximum beam current (nA) | 40 | 10 | 3 | 1 | 1 | 0.5 |
| Damage thickness (nm) | 26 | 13 | 8 | 4 | 3 | 2 |
| Si sputtering yield per ion | 2.7 | 2.1 | 1.7 | 1 | 0.7 | |

*Ve = Va − Vext

The damage thickness shown in Table 1 was determined from the relationship between the Ga acceleration voltage (incident ion energy) and Si damage layer, which is shown in FIG. 2.

When a beam having a diameter of approximately 1 μm and a beam current of 10 nA is to be obtained at an acceleration voltage of 10 kV, Table 1 indicates that the voltage to be applied to the intermediate electrode of the objective lens is −26 kV with its chromatic aberration coefficient being 42 mm when the beam convergence characteristic of the objective lens having a focal length of 14 mm (WD=6 mm) is in the acceleration mode. When, on the other hand, the beam convergence characteristic of the objective lens is in the deceleration mode, Table 1 indicates that the voltage to be applied to the intermediate electrode of the objective lens is 7 kV with its chromatic aberration coefficient being 76 mm. As regards the beam having a beam diameter of approximately 1 μm and prevailing at the above-mentioned acceleration voltage, spherical aberration is overwhelmingly greater than chromatic aberration; therefore, the objective lens need not be operated in the acceleration mode.

If the objective lens is to be operated in the acceleration mode while the acceleration voltage is 10 kV, a voltage of approximately −26 kV is required. For an objective lens operating in the deceleration mode at an acceleration voltage of 30 kV, the application voltage is approximately 21 kV. Therefore, the required dielectric strength voltage is not lower than the dielectric strength voltage of the objective lens operating in the deceleration mode at an acceleration voltage of 30 kV.

When the focused ion beam apparatus shown in FIG. 3 is used at an acceleration voltage between 30 kV and 10 kV or so, the use of an objective lens operating in the deceleration mode is adequate for a beam having a diameter of approximately 1 μm because the spherical aberration component of the third term of Formula 3 is great so as to reduce the influence of chromatic aberration. The objective lens need not operate in the acceleration mode in which dielectric strength requirements are stringent. Therefore, the use of an objective lens operating in the deceleration mode is adequate as far as the energy range is as described above. A single apparatus does not have to use both the acceleration mode and deceleration mode.

When a beam having a diameter of approximately 1 μm and a maximum beam current of approximately 3 nA is to be obtained at an acceleration voltage of 5 kV, the voltage to be applied to the intermediate electrode of the objective lens is −13 kV with its chromatic aberration coefficient being 33 mm when the beam convergence characteristic of the objective lens having a focal length of 14 mm (WD=6 mm) is in the acceleration mode. When, on the other hand, the beam convergence characteristic of the objective lens is in the deceleration mode, the voltage to be applied to the intermediate electrode of the objective lens is 3.5 kV with its chromatic aberration coefficient being 68 mm.

As regards the beam having a beam diameter of approximately 1 μm and prevailing at the above-mentioned acceleration voltage, the chromatic aberration component of the first term of Formula 3 is great. Therefore, when the objective lens is operated in the acceleration mode, the beam diameter is reduced to approximately half with the beam current density increased approximately fourfold as compared to the operation in the deceleration mode.

Similarly, when a beam having a diameter of approximately 1 μm and a beam current of approximately 1 nA is to be obtained at an acceleration voltage of 2 kV, the voltage to be applied to the intermediate electrode of the objective lens is −5.5 kV with its chromatic aberration coefficient being 32 mm when the beam convergence characteristic of the objective lens having a focal length of 14 mm (WD=6 mm) is in the acceleration mode. When, on the other hand, the beam convergence characteristic of the objective lens is in the deceleration mode, the voltage to be applied to the intermediate electrode of the objective lens is 1.4 kV with its chromatic aberration coefficient being 67 mm.

When the acceleration voltage is 2 kV during the use of the configuration shown in FIG. 3, the beam current density can be increased by applying a voltage of approximately 1 kV to the central electrode of the condenser lens without regard to the operation mode of the objective lens.

As regards the beam having a beam diameter of approximately 1 μm and prevailing at an acceleration voltage of 2 kV, the chromatic aberration component of the first term of Formula 3 is great. Therefore, when the objective lens is operated in the acceleration mode, the beam diameter is reduced to approximately half with the beam current density increased approximately fourfold as compared to the operation in the deceleration mode.

Similarly, when a beam having a diameter of approximately 1 μm and a beam current of approximately 1 nA is to be obtained at an acceleration voltage of 1 kV, the voltage to be applied to the intermediate electrode of the objective lens is −2.4 kV with its chromatic aberration coefficient being 39 mm when the beam convergence characteristic of the objective lens having a focal length of 14 mm (WD=6 mm) is in the acceleration mode. When, on the other hand, the beam convergence characteristic of the objective lens is in the deceleration mode, the voltage to be applied to the intermediate electrode of the objective lens is 0.7 kV with its chromatic aberration coefficient being 73 mm.

When the objective lens is operated in the acceleration mode at an acceleration voltage of 1 kV, a powerful lens effect is produced so that the ion gun can achieve focusing on the sample. Therefore, a beam having a relatively high current density is obtained when the condenser lens does not operate. The resulting beam diameter is reduced to approximately half with the beam current density increased approximately fourfold as compared to the operation in the deceleration mode.

As a result, high fabrication positioning accuracy is achieved even when the acceleration voltage is as low as 1 to 2 kV. This makes it possible to conduct high-resolution image observations with a minimum of fabrication and radiation damage.

From now on, more concrete embodiments will be described. Voltages, focal lengths, and other specific numerical values used in the following description are intended only as examples to facilitate understanding.

In an embodiment, disclosed is a focused ion beam apparatus including a liquid metal ion source, an extraction electrode for extracting an ion beam from the liquid metal ion source, an acceleration (ground) electrode for accelerating an ion beam, and an electrostatic lens for converging an ion beam; wherein, when the acceleration voltage for the liquid metal ion source is lower than an emission threshold voltage of the liquid metal ion source, the voltage of the extraction electrode is at a lower potential than the voltage of the acceleration (ground) electrode; and wherein the polarity of a voltage applied to an intermediate electrode existing at the center of the electrostatic lens changes in accordance with the polarity of a voltage applied to the extraction electrode.

In another embodiment, disclosed is a focused ion beam apparatus including a liquid metal ion source, an extraction electrode for extracting an ion beam from the liquid metal ion source, an acceleration (ground) electrode for accelerating an ion beam, and an electrostatic lens for converging an ion beam; wherein, when the acceleration voltage for the liquid metal ion source is lower than an emission threshold voltage of the liquid metal ion source, the voltage of the extraction electrode is at a lower potential than the voltage of the acceleration (ground) electrode; and wherein the polarity of a voltage applied to an intermediate electrode existing between an inlet electrode and an outlet electrode of the electrostatic lens changes in accordance with the polarity of a voltage applied to the extraction electrode.

Also disclosed is a focused ion beam apparatus wherein the distance WD between the lowest surface of an objective lens and a sample is not longer than 6 mm; and wherein the emission threshold voltage of the liquid metal ion source is not lower than 6 kV.

Also disclosed is a focused ion beam apparatus wherein, when the acceleration voltage is not higher than 5 kV, the polarity of a voltage applied to the intermediate electrode of the electrostatic lens changes in accordance with the polarity of a voltage applied to the extraction electrode.

Also disclosed is a focused ion beam apparatus wherein, when the acceleration voltage is not higher than 2 kV, the voltage of an extraction power supply is divided and applied to an intermediate electrode of the objective lens.

First Embodiment

Figure 10:
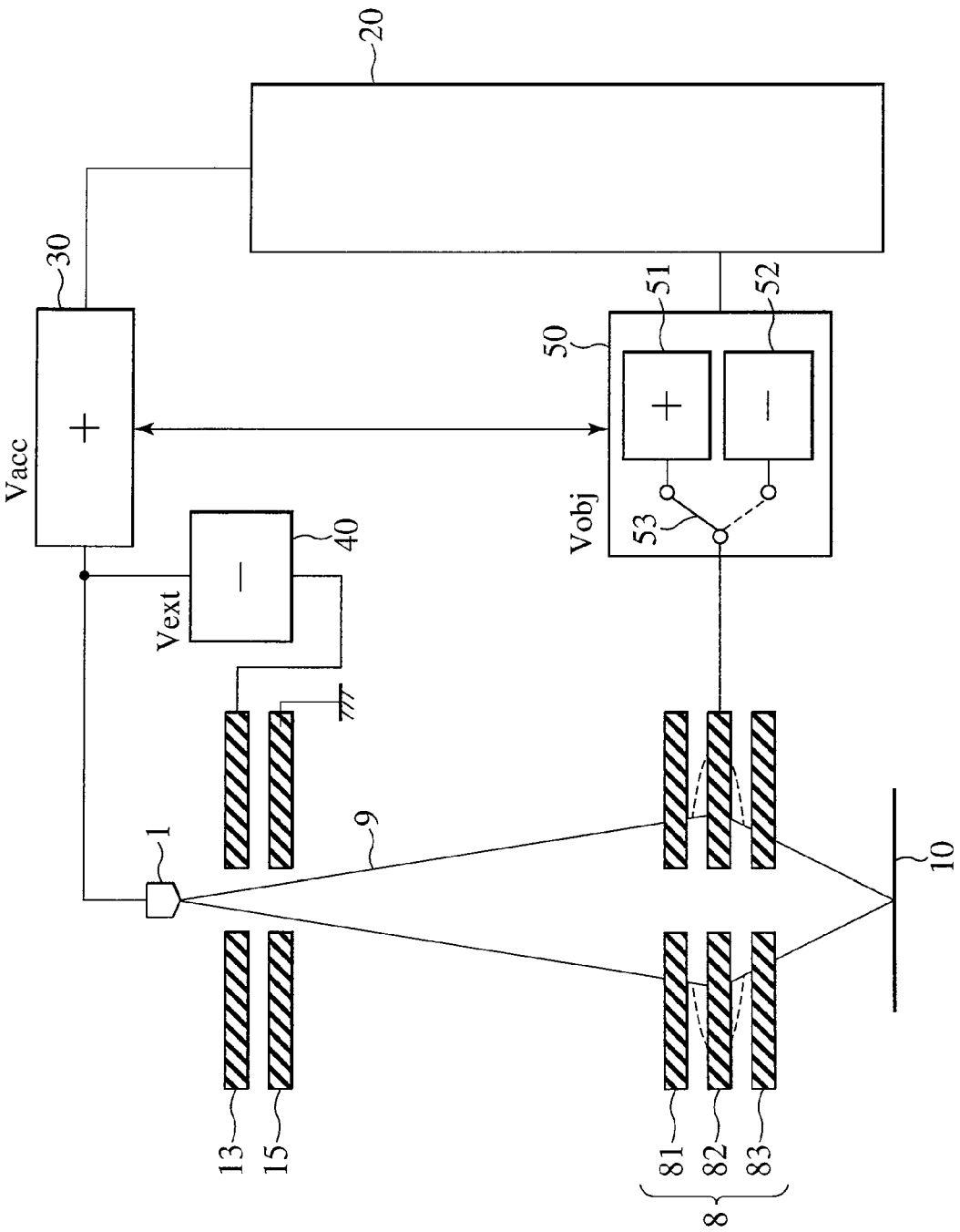
FIG. 10 shows the configuration of a first embodiment.

FIG. 10 is a schematic diagram illustrating the configuration of a first embodiment of the present invention. The first embodiment is configured so that an extraction power supply Vext, which provides an extraction voltage of 0 to −12 kV, is floating-mounted with respect to a 30 kV acceleration power supply Vacc.

The focused ion beam apparatus according to the present embodiment includes a liquid metal ion source 1 for radiating ions, an electrostatic lens 8 which is an objective lens for focusing an ion beam 9 extracted from the liquid metal ion source 1 on a sample 10 or other irradiation target, an extraction electrode 13 for generating the ion beam 9 from the liquid metal ion source 1, and an acceleration (ground) electrode 15 for accelerating the ion beam 9. The focused ion beam apparatus according to the present embodiment also includes an acceleration voltage power supply 30 for accelerating the ion beam 9 radiated from the liquid metal ion source 1, an extraction voltage power supply 40 for applying a potential to the extraction electrode 13, an objective lens power supply 50 for applying a voltage to an intermediate electrode 82 which exists at the center of the electrostatic lens 8, and a high-voltage power supply control system 20 for controlling the power supplies in accordance with the status of the apparatus.

The output voltage setting for the acceleration voltage power supply 30 is variable from 0 kV to 30 kV. The high-voltage power supply control system 20 selects, for instance, a setting of 30 kV.

The extraction voltage power supply 40 outputs a negative voltage that is floating with respect to the acceleration voltage power supply 30. The output voltage setting for the extraction voltage power supply 40 is variable from 0 kV to −12 kV. The high-voltage power supply control system 20 selects, for instance, a setting of −7 kV.

The inlet electrode 81 and the outlet electrode 83, which are positioned on either side of the electrostatic lens 8, are at a ground potential. A voltage supplied from the objective lens power supply 50 is applied to the intermediate electrode 82. The objective lens power supply So includes an objective lens power positive power supply 51, an objective lens power negative power supply 52, and an objective lens power polarity selector switch 53. If, for instance, the acceleration voltage is not higher than the emission threshold value of the liquid metal ion source 1, the high-voltage power supply control system 20 controls the objective lens power polarity selector switch 53 so that the output voltage of the objective lens power negative power supply 52 is applied to the intermediate electrode 82 of the electrostatic lens 8 when a negative potential is applied to the extraction electrode 13.

When an acceleration voltage of 5 kV is to be used with a liquid metal ion source operating, for instance, at an extraction voltage of 7 kV, the potential difference between the ion source and extraction electrode needs to be at least 7 kV. In this instance, therefore, a voltage of +5 kV is applied to the ion source with a voltage of −2 kV applied to the extraction electrode.

Second Embodiment

Figure 11:
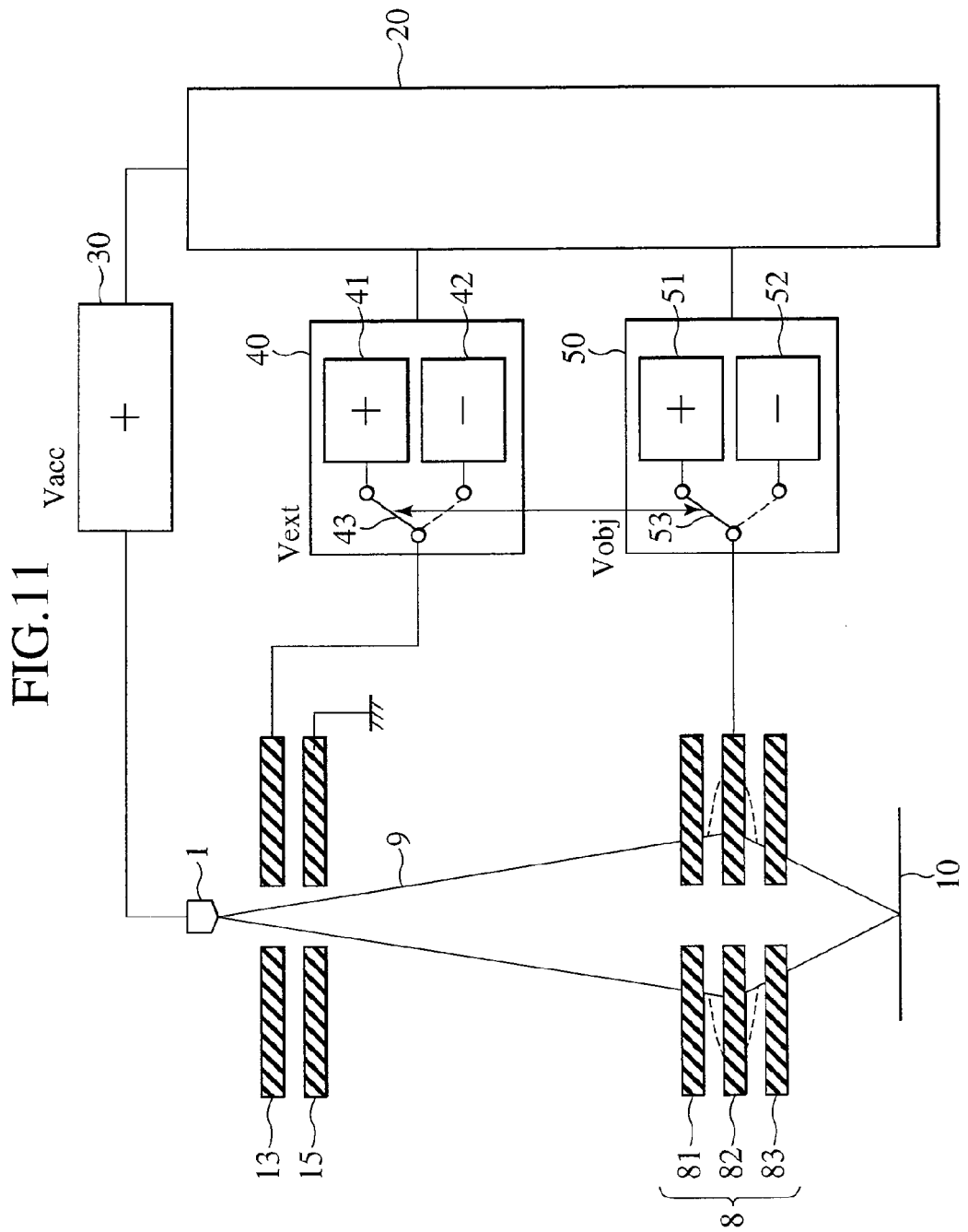
FIG. 11 shows the configuration of a second embodiment.

FIG. 11 is a schematic diagram illustrating the configuration of a second embodiment of the present invention. The second embodiment differs from the first embodiment in that the extraction power supply Vext is not floating-mounted, and switches between positive (0 to 30 kV) extraction power supply and negative (0 to −12 kV) extraction power supply. The second embodiment will now be described mainly with reference to the difference from the first embodiment.

The focused ion beam apparatus according to the second embodiment includes an extraction voltage power supply 40 for applying a potential to the extraction electrode 13, an objective lens power supply 50 for applying a voltage to the intermediate electrode 82 which is positioned at the center of the electrostatic lens 8, and a high-voltage power supply control system 20 for controlling the power supplies in accordance with the status of the apparatus.

The output voltage setting for the acceleration voltage power supply 30 is variable from 0 kV to 30 kV. The high-voltage power supply control system 20 selects, for instance, a setting of 30 kV. The extraction voltage power supply 40 includes an extraction voltage positive power supply 41 for applying a positive voltage to the extraction electrode 13, an extraction voltage negative power supply 42, and an extraction power polarity selector switch 43. As for the extraction voltage power supply 40, the high-voltage power supply control system 20 can select a setting that is variable between 0 and 25 kV or between 0 and −12 kV. When, for instance, the emission threshold voltage of the ion source 1 is 7 kV with the acceleration voltage being 2 kV, a voltage of −5 kV is applied to the extraction electrode 13 with the extraction power polarity selector switch 43 connected to the extraction voltage negative power supply 42.

Third Embodiment

Figure 12:
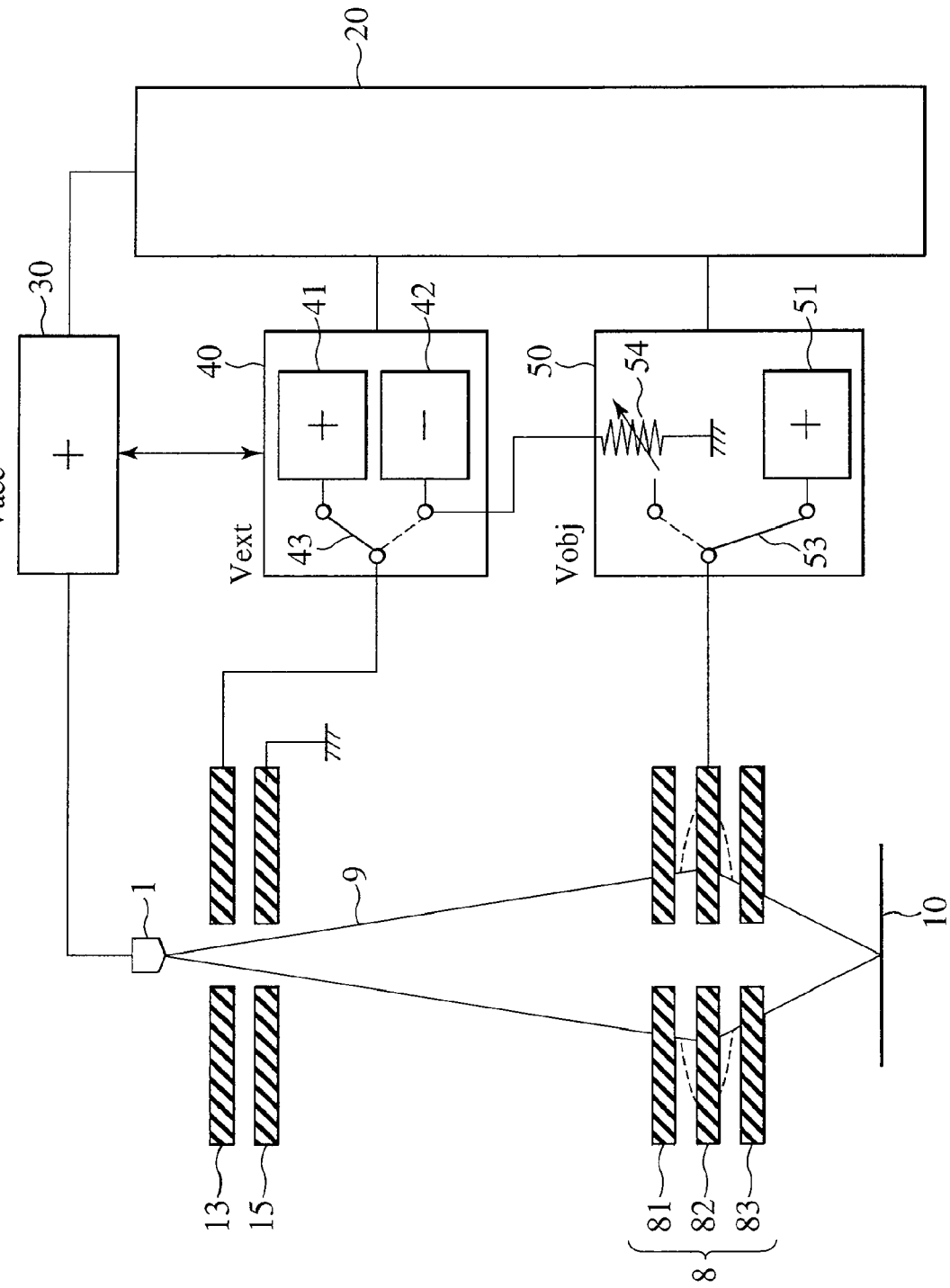
FIG. 12 shows the configuration of a third embodiment.

FIG. 12 is a schematic diagram illustrating the configuration of a third embodiment of the present invention. The third embodiment will now be described mainly with reference to the difference from the first and second embodiments.

In the focused ion beam apparatus according to the third embodiment, the objective lens power supply 50 includes an objective lens power positive power supply 51, a negative objective lens voltage resistive voltage divider terminal 54 which is resistive-voltage-divided from the extraction voltage negative power supply 42, and an objective lens power polarity selector switch 53. If, for instance, the acceleration voltage is not higher than the emission threshold value of the ion source 1, the high-voltage power supply control system 20 controls the objective lens power polarity selector switch 53 so that an negative output voltage of the objective lens voltage resistive voltage divider terminal 54, which is resistive-voltage-divided from the extraction voltage negative power supply 42, is applied to the intermediate electrode 82 of the electrostatic lens 8 when a negative potential is applied to the extraction electrode 13.

Further, if, for instance, the acceleration voltage is not higher than 2 kV, the high-voltage power supply control system 20 switches to the extraction voltage negative power supply 42 and the objective lens voltage resistive voltage divider terminal 54 by operating the extraction power polarity selector switch 43 and the objective lens power polarity selector switch 53 in a coordinated manner.

Fourth Embodiment

Figure 13:
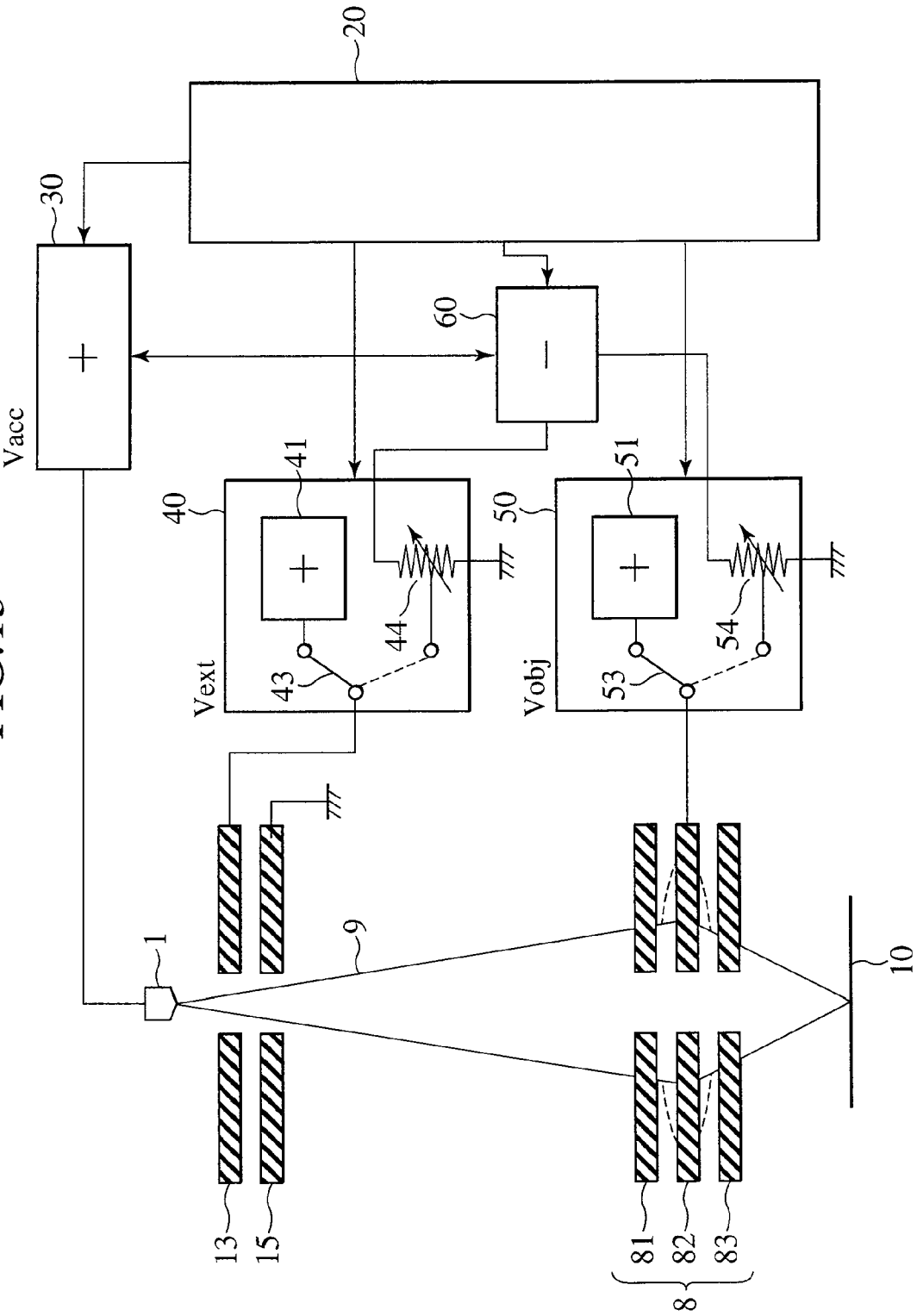
FIG. 13 shows the configuration of a fourth embodiment.

FIG. 13 is a schematic diagram illustrating the configuration of a fourth embodiment of the present invention. The fourth embodiment will now be described mainly with reference to the difference from the first to third embodiments.

The focused ion beam apparatus according to the fourth embodiment includes an acceleration voltage power supply 30 for accelerating an ion beam 9 that is radiated from the liquid metal ion source 1, an extraction voltage power supply 40 for applying a potential to the extraction electrode 13, an objective lens power supply 50 for applying a voltage to the intermediate electrode 82 which is positioned at the center of the electrostatic lens 8, a negative voltage application power supply 60, and a high-voltage power supply control system 20 for controlling the power supplies in accordance with the status of the apparatus.

The output voltage of the negative voltage application power supply 60 is set, for instance, at −12 kV.

The output voltage setting for the acceleration voltage power supply 30 is variable from 0 kV to 30 kV. The high-voltage power supply control system 20 selects, for instance, a setting of 30 kV.

The extraction voltage power supply 40 includes an extraction voltage positive power supply 41 for applying a positive voltage to the extraction electrode 13, an extraction voltage resistive voltage divider terminal 44 for resistive-voltage-dividing and applying the output voltage of the negative voltage application power supply 60 which applies a negative voltage, and an extraction power polarity selector switch 43. For example, the high-voltage power supply control system 20 can select a setting that is variable between 0 and 25 kV or between 0 and −12 kV. When, for instance, the emission threshold voltage of the ion source 1 is 7 kV with the acceleration voltage being 2 kV, a voltage of −5 kV is applied to the extraction electrode 13 with the extraction power polarity selector switch 43 connected to the extraction voltage resistive voltage divider terminal 44.

The inlet electrode 81 and the outlet electrode 83, which are positioned on either side of the electrostatic lens 8, are at a ground potential. A voltage supplied from the objective lens power supply 50 is applied to the intermediate electrode 82, which is at a ground potential. The objective lens power supply 50 includes an objective lens power positive power supply 51, an objective lens voltage resistive voltage divider terminal 54 for resistive-voltage-dividing and applying the output voltage of the negative voltage application power supply 60, and an objective lens power polarity selector switch 53. If, for instance, the acceleration voltage is not higher than the emission threshold value of the ion source 1, the high-voltage power supply control system 20 controls the objective lens power polarity selector switch 53 so that a negative output voltage of the objective lens voltage resistive voltage divider terminal 54, which is resistive-voltage-divided from the extraction voltage negative power supply 42, is applied to the intermediate electrode 82 of the electrostatic lens 8 when a negative potential is applied to the extraction electrode 13. If, for instance, the acceleration voltage is not higher than 2 kV, the high-voltage power supply control system 20 switches to the extraction voltage negative power supply 42 and the objective lens voltage resistive voltage divider terminal 54 by operating the extraction power polarity selector switch 43 and the objective lens power polarity selector switch 53 in a coordinated manner.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A focused ion beam apparatus comprising:
    a liquid metal ion source to which a desired acceleration voltage is applied;
    an extraction electrode for extracting an ion beam from the liquid metal ion source;
    an acceleration electrode for accelerating an ion beam to a desired energy; and
    an electrostatic lens for converging an ion beam;
    wherein, when the acceleration voltage applied to the liquid metal ion source is lower than an emission threshold voltage of the liquid metal ion source, the voltage of the extraction electrode is at a lower potential than the voltage of the acceleration electrode; and
    wherein the polarity of a voltage applied to an intermediate electrode existing at the center of the electrostatic lens changes in accordance with the polarity of a voltage applied to the extraction electrode.

2. The focused ion beam apparatus according to claim 1, wherein the working distance between the lowest surface of an objective lens and a sample is not longer than 6 mm; and wherein the emission threshold voltage of the liquid metal ion source is not lower than 6 kV.

3. The focused ion beam apparatus according to claim 1, wherein, when the acceleration voltage is not higher than 5 kV, the polarity of a voltage applied to the intermediate electrode of the electrostatic lens changes in accordance with the polarity of a voltage applied to the extraction electrode.

4. The focused ion beam apparatus according to claim 1, wherein, when the acceleration voltage is not higher than 2 kV, the voltage of an extraction power supply is divided and applied to an intermediate electrode of the electrostatic lens.

5. A focused ion beam apparatus comprising:
    a liquid metal ion source to which a desired acceleration voltage is applied;
    an extraction electrode for extracting an ion beam from the liquid metal ion source;
    an acceleration electrode for accelerating an ion beam to a desired energy; and
    an electrostatic lens for converging an ion beam;
    wherein, when the acceleration voltage applied to the liquid metal ion source is lower than an emission threshold voltage of the liquid metal ion source, the voltage of the extraction electrode is at a lower potential than the voltage of the acceleration electrode; and
    wherein the polarity of a voltage applied to an intermediate electrode existing between an inlet electrode and an outlet electrode of the electrostatic lens changes in accordance with the polarity of a voltage applied to the extraction electrode.

6. The focused ion beam apparatus according to claim 5, wherein the working distance between the lowest surface of an objective lens and a sample is not longer than 6 mm; and wherein the emission threshold voltage of the liquid metal ion source is not lower than 6 kV.

7. The focused ion beam apparatus according to claim 5, wherein, when the acceleration voltage is not higher than 5 kV, the polarity of a voltage applied to the intermediate electrode of the electrostatic lens changes in accordance with the polarity of a voltage applied to the extraction electrode.

8. The focused ion beam apparatus according to claim 5, wherein, when the acceleration voltage is not higher than 2 kV, the voltage of an extraction power supply is divided and applied to an intermediate electrode of the electrostatic lens.

9. A focused ion beam apparatus comprising:
    a liquid metal ion source to which a desired acceleration voltage is applied;
    an extraction electrode for extracting an ion beam from the liquid metal ion source;
    a ground electrode for accelerating an ion beam to a desired energy; and
    an electrostatic lens for converging an ion beam;
    wherein, when the acceleration voltage of an ion beam is lower than an emission threshold voltage of the liquid metal ion source, the voltage of the extraction electrode is at a lower potential than the voltage of the ground electrode; and wherein the polarity of a voltage applied to an intermediate electrode existing at the center of the electrostatic lens changes in accordance with the polarity of a voltage applied to the extraction electrode.

10. The focused ion beam apparatus according to claim 9, wherein the working distance between the lowest surface of an objective lens and a sample is not longer than 6 mm; and wherein the emission threshold voltage of the liquid metal ion source is not lower than 6 kV.

11. The focused ion beam apparatus according to claim 9, wherein, when the acceleration voltage is not higher than 5 kV, the polarity of a voltage applied to the intermediate electrode of the electrostatic lens changes in accordance with the polarity of a voltage applied to the extraction electrode.

12. The focused ion beam apparatus according to claim 9, wherein, when the acceleration voltage is not higher than 2 kV, the voltage of an extraction power supply is divided and applied to an intermediate electrode of the electrostatic lens.

13. A focused ion beam apparatus comprising:
  a liquid metal ion source to which a desired acceleration voltage is applied;
  an extraction electrode for extracting an ion beam from the liquid metal ion source;
  a ground electrode for accelerating an ion beam to a desired energy; and
  an electrostatic lens for converging an ion beam;
  wherein, when the acceleration voltage of an ion beam is lower than an emission threshold voltage of the liquid metal ion source, the voltage of the extraction electrode is at a lower potential than the voltage of the ground electrode; and
  wherein the polarity of a voltage applied to an intermediate electrode existing between an inlet electrode and an outlet electrode of the electrostatic lens changes in accordance with the polarity of a voltage applied to the extraction electrode.

14. The focused ion beam apparatus according to claim 13, wherein the working distance between the lowest surface of an objective lens and a sample is not longer than 6 mm; and wherein the emission threshold voltage of the liquid metal ion source is not lower than 6 kV.

15. The focused ion beam apparatus according to claim 13, wherein, when the acceleration voltage is not higher than 5 kV, the polarity of a voltage applied to the intermediate electrode of the electrostatic lens changes in accordance with the polarity of a voltage applied to the extraction electrode.

16. The focused ion beam apparatus according to claim 13, wherein, when the acceleration voltage is not higher than 2 kV, the voltage of an extraction power supply is divided and applied to an intermediate electrode of the electrostatic lens.

* * * * *